(12) United States Patent  
Mallikarjunaswamy

(10) Patent No.: US 7,608,907 B2
(45) Date of Patent: Oct. 27, 2009

(54) LDMOS GATE CONTROLLED SCHOTTKY DIODE

(75) Inventor: Shekar Mallikarjunaswamy, San Jose, CA (US)

(73) Assignee: Micrel, Inc., San Jose, CA (US)

( * ) Notice: Subject to any disclaimer, the term of this patent is extended or adjusted under 35 U.S.C. 154(b) by 146 days.

(21) Appl. No.: 11/031,201

(22) Filed: Jan. 6, 2005

(65) Prior Publication Data

US 2006/0145185 A1 Jul. 6, 2006

(51) Int. Cl.
*H01L 21/336* (2006.01)
(52) U.S. Cl. ............... 257/476; 257/280; 257/281; 257/E27.068; 257/E29.338
(58) Field of Classification Search ............... 257/476, 257/280, 281, E27.068, E29.338
See application file for complete search history.

(56) References Cited

U.S. PATENT DOCUMENTS

| | | | |
|---|---|---|---|
| 4,801,983 A | 1/1989 | Ueno et al. | |
| 5,430,323 A | 7/1995 | Yamazaki et al. | |
| 5,614,755 A * | 3/1997 | Hutter et al. | 257/471 |
| 5,925,910 A * | 7/1999 | Menegoli | 257/335 |
| 6,133,107 A * | 10/2000 | Menegoli | 438/306 |
| 6,573,562 B2 * | 6/2003 | Parthasarathy et al. | 257/338 |
| 6,784,489 B1 * | 8/2004 | Menegoli | 257/343 |
| 7,019,377 B2 * | 3/2006 | Tsuchiko | 257/476 |
| 7,141,860 B2 * | 11/2006 | Khemka et al. | 257/471 |
| 2005/0098845 A1 * | 5/2005 | Matsudai et al. | 257/476 |

* cited by examiner

*Primary Examiner*—Eugene Lee
(74) *Attorney, Agent, or Firm*—Sawyer Law Group P.C.

(57) ABSTRACT

An improved diode is disclosed. The diode comprises a Schottky diode and a LDMOS device coupled in series with the Schottky diode. In a preferred embodiment, a forward current from the Schottky diode is allowed to flow through the channel of a depletion mode LDMOS that allows gate control over Schottky forward current. Integrating the Schottky diode into the drain of the depletion mode LDMOS forms the device structure.

2 Claims, 3 Drawing Sheets

US 7,608,907 B2

LDMOS GATE CONTROLLED SCHOTTKY DIODE

FIELD OF THE INVENTION

The present invention relates to a circuit device and more particularly to an improved Schottky diode.

BACKGROUND OF THE INVENTION

FIG. 1 illustrates a conventional Schottky diode 10. As seen from this structure, the forward current for the Schottky diode 10 flows from the anode 12 into the N-well 11/N-epi 13/NBL 14 and is collected by N-sinker diffusion 16. The N-sinker diffusion 16 in conjunction with N-type buried layer (NBL) 14 is used to reduce the series cathode resistance of the Schottky diode 10.

Conventional Schottky diodes conduct in forward mode when the anode to cathode voltage exceeds the metal to semiconductor barrier potential. However, for some applications, for example, voltage converter applications, a forward blocking Schottky diode is desirable to disconnect the input voltage appearing at its anode with the cathode that drives the load.

One solution that is used in the industry is to use synchronous rectification. In synchronous rectification the body diode of NMOS+the channel current—however then you cannot impede current through the body diode. But if the body of the NMOS is switched then it is possible to impede the current; however, if the body is switched, i.e., the body is tied to source/inductor and drain/cathode to load during forward conduction and the body gets switched to ground when no current is desired, this requires a low resistance switch to short the body to source and the switch must be able to carry current so the circuitry gets complicated. Accordingly, synchronous rectification requires additional level shifting and driving circuitry for the NMOSFET that impacts the efficiency of the part at higher voltages. Due to the above mentioned reasons, a Schottky diode that is capable of both forward and reverse blocking is desirable.

The present invention addresses such a need.

SUMMARY OF THE INVENTION

An improved diode is disclosed. The diode comprises a Schottky diode and a LDMOS device coupled in series with the Schottky diode. In a preferred embodiment, a forward current from the Schottky diode is allowed to flow through the channel of a depletion mode LDMOS device that allows gate control over Schottky forward current. Integrating the Schottky diode into the drain of the depletion mode LDMOS forms the device structure.

DETAILED DESCRIPTION

The present invention relates to a circuit device and more particularly to an improved Schottky diode. The following description is presented to enable one of ordinary skill in the art to make and use the invention and is provided in the context of a patent application and its requirements. Various modifications to the preferred embodiment and the generic principles and features described herein will be readily apparent to those skilled in the art. Thus, the present invention is not intended to be limited to the embodiment shown but is to be accorded the widest scope consistent with the principles and features described herein.

Figure 1:
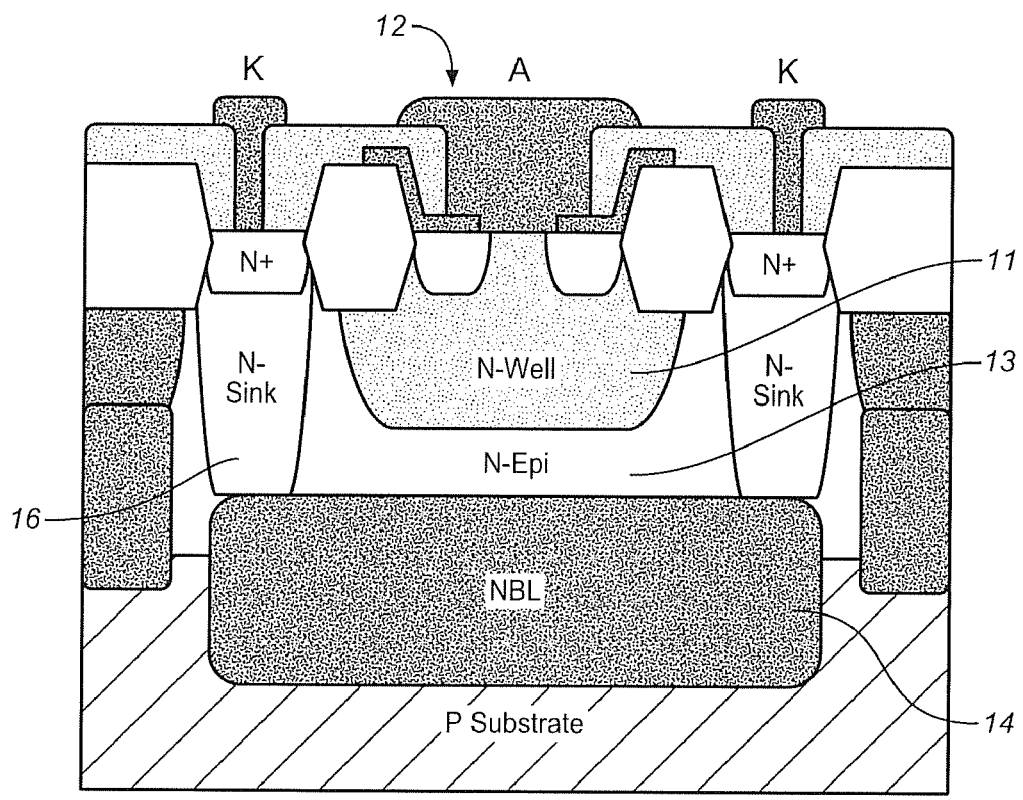
FIG. 1 illustrates a conventional Schottky diode.
Figure 2A:
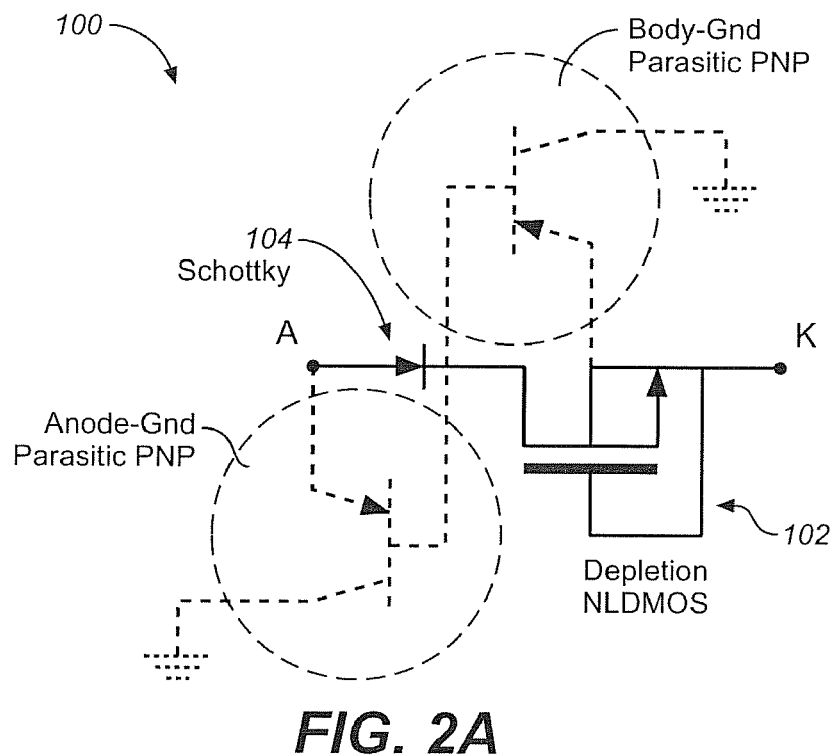
FIG. 2A illustrates an equivalent circuit of the Schottky diode in accordance with the present invention.
Figure 2B:
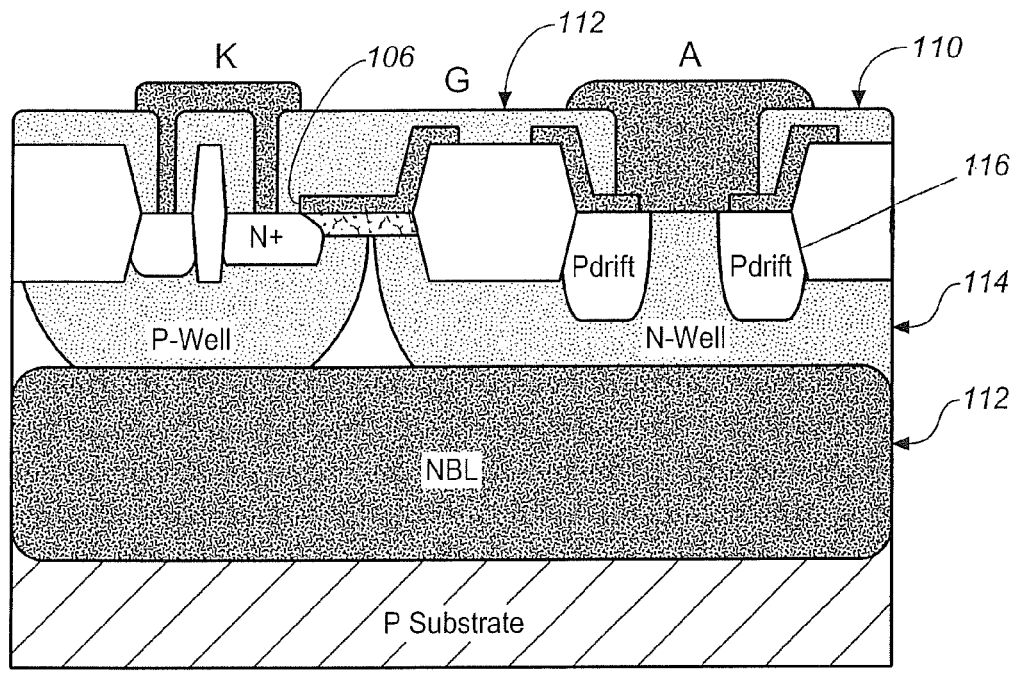
FIG. 2B illustrates a cross-section of the Schottky diode in accordance with the present invention.

An equivalent circuit 100 of the Schottky diode structure in accordance with the present invention is shown in FIG. 2A and its cross-section in FIG. 2B. The equivalent circuit 100 shows the concept of the present invention where the Schottky diode 104 is connected in series with a depletion mode N-channel LDMOS device 102. As is well known, although the present invention describes utilizing a depletion mode N-channel LDMOS device, a variety of MOS devices could be utilized and be within the specification and scope of the present invention.

The Schottky diode 104 is integrated into the Nwell drain of the depletion NLDMOS 106 as shown in FIG. 2B. As a result of the integration, two parasitic PNP transistors are formed from the anode 110 and the NLDMOS body to ground. The heavily doped N type buried layer (NBL) 112 reduces the gain of these parasitic PNPs. When the gate of the NLDMOS is tied to the cathode of the Schottky an n-channel is formed on the surface of the P-well under the gate.

Figure 2C:
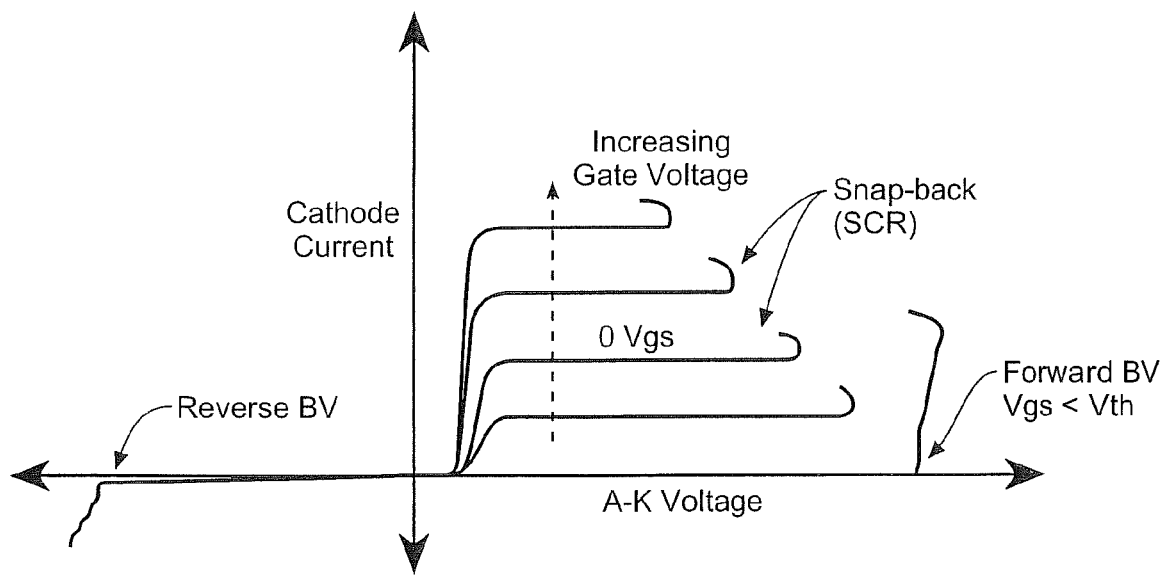
FIG. 2C illustrates gate voltage biased positive with respect to the cathode of the device.

When the anode is biased positive with respect to cathode electrons flow from the cathode through the depletion channel 106 into the N-well region 114 and are collected by the anode terminal 110. If the gate voltage of the depletion channel 106 is biased negative with respect to its cathode beyond the depletion threshold voltage then the channel is no longer conductive and the Schottky diode enters its forward blocking mode. However, if the gate voltage is biased positive with respect to cathode then the channel is more conductive as shown in FIG. 2C.

In the forward conduction mode when anode to cathode voltage exceeds the knee voltage of the Schottky barrier potential the forward current can be saturated. During current saturation the forward voltage is dropped across the N-well/P-well drain junction of the depletion NLDMOS. When the anode to cathode voltage is reversed then the Schottky diode enters its reverse blocking state. In the reverse blocking state although the Pwell body to Nwell drain junction is forward biased the Schottky is in its reverse blocking mode that impedes current flow.

In FIG. 2B, the P-drift reduces surface leakage currents in the Schottky and the poly field plate 112 connected to the anode 110 improves surface breakdown during reverse blocking state. The integration of the P-drift region 116 into N-well 114 forms a parasitic thyristor that is formed between the N+ source, Pwell, Nwell and Pdrift regions. In the forward blocking state when the anode to cathode potential exceeds the Pdrift region 116 to Nwell region 114, the Pdrift region 116 is forward biased and injects holes into the N-well region 114, the Pdrift region 116 is forward biased and injects holes into the N-well region 114 that are collected by the P-well region 116 that flow under the N+ source region into P+ body contact forward bias the N+ source to P-well junction resulting in parasitic thyristor latch-up action. After latch-up, gate control over the Schottky diode is lost.

Figure 3A:
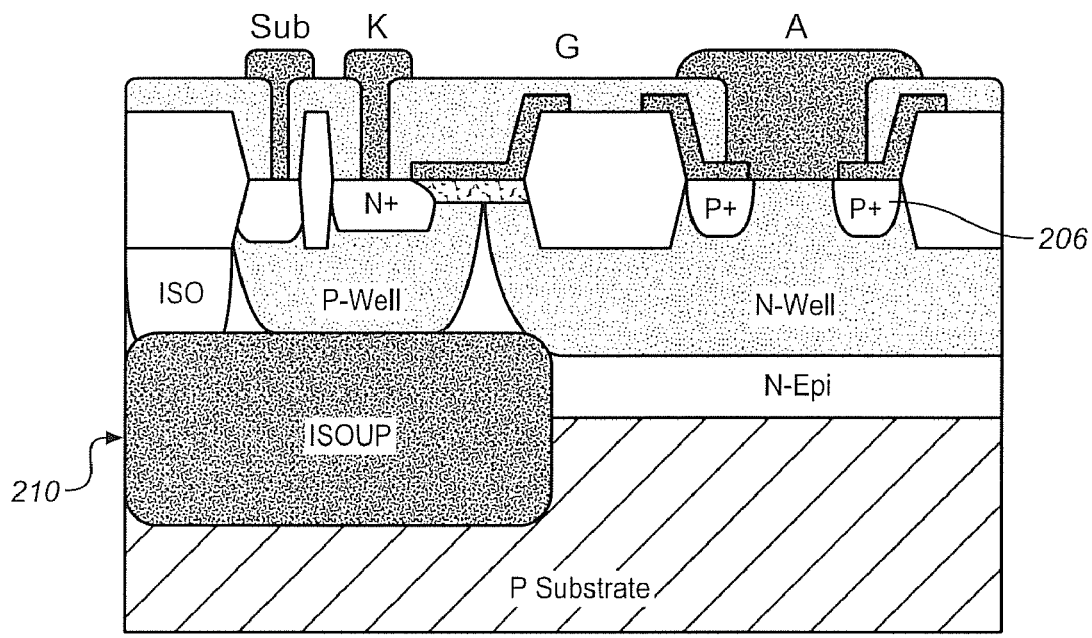
FIGS. 3A and 3B illustrates two additional embodiments of the Schottky diode in accordance with the present invention.
Figure 3B:
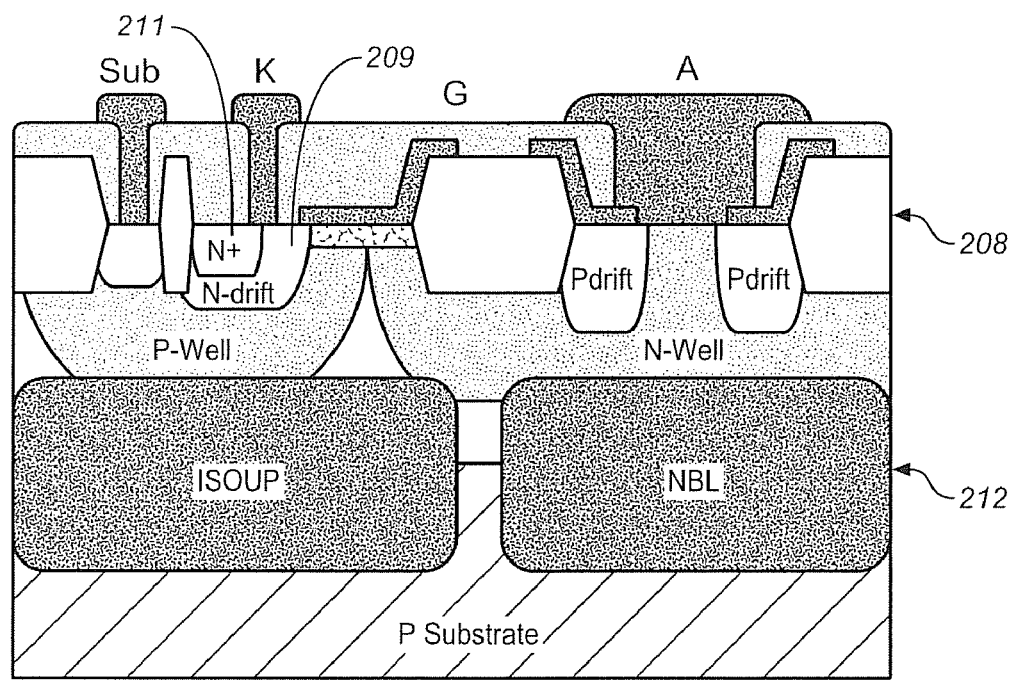

Two other embodiments of the Schottky diode in accordance with the present invention are shown in FIG. 3A and FIG. 3B. FIGS. 3A and 3B illustrate two embodiments of non-isolated MOS controlled Schottky diodes 204a and 204b, wherein diode 204a includes P+guard ring 206 (FIG. 3A) and wherein diode 204b includes a P-drift guard ring 208 with an N-drift source region (FIG. 3B). In FIG. 3A, a body 210 of the N-channel depletion MOSFET is not isolated from the substrate due to absence of N-type buried layer (NBL). As a result of this, the P+body 210 cannot be shorted to the source of the NMOSFET, thereby introducing a body effect to the NMOSFET that increases the threshold voltage. In addition, when the cathode voltage goes high with respect to P-substrate the N+source to P-well junction breakdown limits the reverse blocking voltage of the Schottky diode 204a.

A method to increase this reverse blocking voltage is shown in FIG. 3B, where a N-drift diffusion 209 which is of a lower doping concentration than N+ source diffusion 211 is used to connect the depletion channel to the N+ source contact region. Since the N-drift region 209 is of lower doping concentration than the N+ source diffusion 211 the breakdown voltage of the Schottky diode 204b in the reverse blocking state is enhanced. The P-drift guard ring 208 in FIG. 3B is used to enhance the reverse blocking state of the Schottky diode 204b. Lowering the doping concentration of the P-drift guard ring 208 and increasing its junction depth increases the reverse blocking voltage of the Schottky 204b. The addition of partial NBL 212 reduces the N-well resistance of the Schottky diode 204b.

An improved diode is disclosed. The diode comprises comprising a Schottky diode and a LDMOS device coupled in series with the Schottky diode. In a preferred embodiment, a forward current from the Schottky diode is allowed to flow through the channel of a depletion mode LDMOS that allows gate control over Schottky forward current. Integrating the Schottky diode into the drain of the depletion mode LDMOS forms the device structure.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A diode comprising:
    a Schottky diode; and
    a LDMOS device coupled in series with the Schottky diode, wherein the Schottky diode is integrated into an N-well drain of the LDMOS device and allows for forward current flow and the LDMOS device supports the forward voltage when the diode enters current saturation, wherein the LDMOS device allows reverse current to flow and the diode blocks the reverse current, the LDMOS device further comprising:
    a LDMOS body-ground parasitic PNP transistor;
    an anode-ground parasitic PNP transistor;
    an N-type buried layer disposed near a P-type substrate within the LDMOS device, wherein the N-type buried layer reduces the gain of the LDMOS body-ground parasitic PNP transistor and the anode-ground parasitic PNP transistor;
    a p+ guard ring within the LDMOS device to allow for an increased reverse blocking state of the LDMOS device;
    N− source diffusion; and
    an N-drift region, wherein the N-drift region is of a lower doping concentration that the N+ source diffusion to enhance the increased reverse blocking state of the diode.

2. The diode of claim 1 wherein the LDMOS device comprises a depletion mode N-channel LDMOS device.

* * * * *